(12) United States Patent
Ihs

(10) Patent No.: US 10,840,869 B2
(45) Date of Patent: Nov. 17, 2020

(54) CAPACITIVE MEMS MICROPHONE WITH ACTIVE COMPRESSION

(71) Applicant: Hassan Ihs, San Diego, CA (US)

(72) Inventor: Hassan Ihs, San Diego, CA (US)

(73) Assignee: Chaoyang Semiconductor Jiangyin Technology Co., Ltd., Jiangyin (CN)

( * ) Notice: Subject to any disclaimer, the term of this patent is extended or adjusted under 35 U.S.C. 154(b) by 0 days.

(21) Appl. No.: 16/536,244

(22) Filed: Aug. 8, 2019

(65) Prior Publication Data

US 2020/0052668 A1 Feb. 13, 2020

Related U.S. Application Data

(60) Provisional application No. 62/715,963, filed on Aug. 8, 2018.

(51) Int. Cl.
| | |
|---|---|
| *H04R 3/00* | (2006.01) |
| *H03F 3/183* | (2006.01) |
| *H03G 3/20* | (2006.01) |
| *H03M 3/00* | (2006.01) |
| *H03G 3/30* | (2006.01) |
| *H03M 1/12* | (2006.01) |
| *H04R 1/04* | (2006.01) |

(52) U.S. Cl.
CPC .......... *H03G 3/3005* (2013.01); *H03F 3/183* (2013.01); *H03M 1/12* (2013.01); *H03M 3/30* (2013.01); *H04R 1/04* (2013.01)

(58) Field of Classification Search
CPC . H04R 3/00; H04R 3/006; H04R 1/00; H04R 1/04; H04R 19/00; H04R 19/005; H04R 19/04; H04R 23/00; H04R 2201/003; H03G 3/002; H03G 3/20; H03G 3/30; H03G 3/3005; H03G 3/2089; H03F 3/182; H03F 3/183; H03F 3/187; H03M 3/30; H03M 3/49; H03M 1/12

See application file for complete search history.

(56) References Cited

U.S. PATENT DOCUMENTS

| | | | |
|---|---|---|---|
| 9,831,844 B2 | 11/2017 | Yurrtas et al. | |
| 2001/0054937 A1* | 12/2001 | Hyvonen | H03H 7/40 333/32 |

(Continued)

FOREIGN PATENT DOCUMENTS

KR 10-1231866 B1 2/2013

OTHER PUBLICATIONS

International Search Report on related PCT Application No. PCT/US2019/045799 from International Searching Authority (KIPO) dated Dec. 11, 2019.

(Continued)

*Primary Examiner* — Thang V Tran
(74) *Attorney, Agent, or Firm* — Klein, O'Neill & Singh, LLP

(57) ABSTRACT

A digital microphone compresses a large voltage swing signal from a MEMS capacitor to a signal suitable for processing by integrated circuitry. The compression may be performed in an analog domain by selectively coupling adjustment capacitors in parallel to the MEMS capacitor. The digital microphone may decompress the signal in the digital domain using a decompression technique substantially an inverse of the compression performed in the analog domain.

11 Claims, 7 Drawing Sheets

(56) References Cited

U.S. PATENT DOCUMENTS

| | | | |
|---|---|---|---|
| 2004/0147237 A1* | 7/2004 | Eckl | H03F 3/195 |
| | | | 455/150.1 |
| 2005/0262947 A1 | 12/2005 | Dehe | |
| 2009/0174496 A1* | 7/2009 | Van Bezooijen | H03F 1/56 |
| | | | 333/17.3 |
| 2009/0322353 A1 | 12/2009 | Ungaretti et al. | |
| 2010/0158276 A1 | 6/2010 | Wu et al. | |
| 2012/0328129 A1 | 12/2012 | Schuurmans | |
| 2013/0051582 A1* | 2/2013 | Kropfitsch | H03F 1/56 |
| | | | 381/111 |
| 2013/0271307 A1* | 10/2013 | Kropfitsch | H03G 3/002 |
| | | | 341/158 |
| 2016/0087596 A1* | 3/2016 | Yurrtas | H04R 1/04 |
| | | | 381/111 |
| 2016/0344360 A1 | 11/2016 | Kropfitsch et al. | |
| 2018/0109869 A1 | 4/2018 | Opris et al. | |
| 2018/0145630 A1* | 5/2018 | Zhang | H03B 5/1262 |
| 2019/0212358 A1* | 7/2019 | Oshima | G01P 15/0802 |
| 2019/0360882 A1* | 11/2019 | Arndt | G01L 9/0072 |

OTHER PUBLICATIONS

Written Opinion on related PCT Application No. PCT/US2019/045799 from International Searching Authority (KIPO) dated Dec. 11, 2019.

\* cited by examiner

CAPACITIVE MEMS MICROPHONE WITH ACTIVE COMPRESSION

CROSS REFERENCE TO RELATED APPLICATION

This application claims the benefit of the filing date of U.S. Provisional Patent Application No. 62/715,963, filed on Aug. 8, 2018, the disclosure of which is incorporated by reference herein.

BACKGROUND OF THE INVENTION

The present invention relates generally to digital microphones, and more particularly to digital microphones with capacitive compression.

Digital microphones may be used in devices providing for voice recognition or operation by way of voice commands. These devices may include those commonly associated with voice communications, such as cellular phones, particularly phones that may be classified as smart phones. But the devices may also include devices not usually associated with voice operations, for example devices such as televisions, refrigerators, or other household devices. The devices may also include relatively new devices, such as those providing interfaces to virtual assistants.

Many of these devices operate using integrated circuitry. The integrated circuitry performs a variety of operations, including processing of signals provided by microphones of the digital microphones, along with other logic related operations, memory related operations, and possibly communications related operations.

Integrated circuitry generally operates at low voltage levels. There are many reasons why low voltage operation is desirable for integrated circuitry operation, including reasons relating to power usage, speed of operation, and other reasons. For mobile and other battery powered devices, low power usage may be particularly important, for example to allow for greater usage between recharging of the battery. Even for other devices, however, low power operation may be desirable, particularly for those devices which may be desired to be always on, at least for possibly receiving and processing a voice based command.

Desired dynamic ranges for digital microphones may be relatively large. It may be desirable for the dynamic range to cover very loud sounds as well as barely audible sounds. Moreover, for some applications, for example voice recognition applications, it may be desirable to have relatively high signal to noise ratios for audio based signals. Unfortunately, microphones of digital microphones may have components which may have difficulties in providing such signals, particularly in view of voltage levels used in integrated circuitry.

BRIEF SUMMARY OF THE INVENTION

In some embodiments a digital microphone includes a microelectromechanical system (MEMS) capacitor and further capacitances, the MEMS capacitor coupled to a processing chain including a preamplifier, an analog-to-digital converter (ADC), and a digital signal processing (DSP) circuit, with the further capacitances varied over time to provide for analog compression of signals provided to the preamplifier. In some embodiments the DSP circuit is configured to perform a decompression function, the decompression function including decompression of the analog compression.

Some embodiments provide a digital microphone, comprising: a microelectromechanical system (MEMS) capacitor; a plurality of adjustment capacitors selectively coupleable in parallel to the MEMS capacitor, the adjustment capacitors selectively coupleable to the MEMS capacitor to achieve a compression in the form of $x/(1+N|x|)$ of a voltage output of the MEMS capacitor, N being a compression index number greater than 1; and a processing chain coupled to one side of the MEMS capacitor, the processing chain including, in sequence, a preamplifier, an analog-to-digital converter (ADC), and a decompression module, the decompression module being configured to perform a decompression substantially an inverse of the compression in the form of $x/(1+N|x|)$.

Some embodiments provide a method for processing signals for a digital microphone, comprising: selectively coupling a plurality of adjustment capacitors in parallel with a microelectromechanical system (MEMS) capacitor serving as a sensor for a digital microphone, so as to perform a first compression technique on a signal generated by the MEMS capacitor; amplifying the signal from the MEMS capacitor, to provide an amplified signal; digitizing the amplified signal, to prove a digital signal; and performing a digital operation on the digital signal, the digital operation being an inverse of the first compression technique.

These and other aspects of the invention are more fully comprehended upon review of this disclosure.

DETAILED DESCRIPTION

Figure 1:
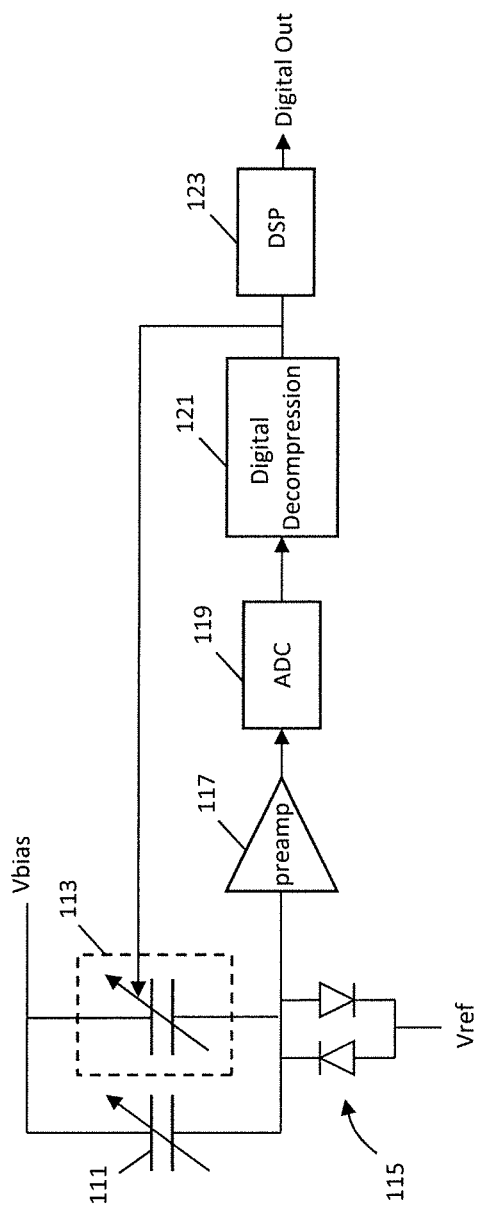
FIG. 1 is a semi-schematic, semi-block diagram of a digital microphone in accordance with aspects of the invention.

FIG. 1 is a semi-schematic, semi-block diagram of a digital microphone in accordance with aspects of the invention. In FIG. 1, a MEMS capacitor 111 provides a sensor for a digital microphone. The MEMS capacitor is shown as being in parallel to an attenuation capacitor 113. In other embodiments the MEMS capacitor and the attenuation capacitor may be in parallel. First sides of the capacitors are coupled to a bias voltage. Second sides of the capacitors are coupled to a reference voltage, through a giga-ohm range resistance in some embodiments, through antiparallel diodes 115 as illustrated in FIG. 1.

The second side of the capacitors is also coupled to an input of a processing chain. The processing chain of FIG. 1 includes, in sequence, a preamplifier 117, an analog-to-digital converter (ADC) 119, a digital decompression module 121, and a digital signal processing circuit 123. The preamplifier amplifies the input signal provided by the capacitors. The ADC converts the amplified signal to a digital signal. In most embodiments the ADC oversamples the amplified signal. The ADC in most embodiments is a sigma-delta ADC, although a delta-sigma ADC or other ADC may be used in some embodiments. The digital signal is decompressed by the digital decompression module, and the decompressed signal may be further processed by the DSP.

Capacitance provided by the attenuation capacitor is modified based on a signal from the digital decompression module, although various other signals may be used instead. The capacitance provided by the attenuation capacitor is modified so as to perform analog compression on the input signal, with the digital decompression module performing corresponding decompression. In most embodiments the compression is of the form $v=x/(1+N|x|)$, as discussed herein. The compression of this form may be implemented by way of changing the capacitance of the attenuation capacitor, which in many embodiments comprises a plurality of attenuation capacitors, for example in parallel, that may be selectively coupled in parallel to the MEMS capacitor. In most embodiments the decompression is of the form $v/(1-(N+1)|v|)$, for a positive signal, and $v/(1-(N-1)/v/)$, for a negative signal.

Operation of the analog compression may be further understood considering the following. In general, with no pressure applied to the MEMS capacitor, charge Q on the capacitors may be considered as being $$Q=(Ca+Cm)V\text{bias},$$

with Ca being capacitance of the attenuation capacitor and Cm being capacitance of the MEMS capacitor. With pressure applied to the MEMS capacitor, the charge Q may be considered as $$Q=(Ca+Cm(1+kp))(V\text{bias}+v),$$

with kp related to the pressure and v being the voltage of the input signal (provided to the processing chain). Accordingly, $$v=-V\text{bias}((kp/(1+Ca/Cm)/(1+kp/(1+Ca/Cm)),$$

with for convenience replacing kp with x, and for the situation with Ca=0, $$v=-V\text{bias}(x/(1+x)).$$

Such a situation indicates that the input signal, without the attenuation capacitor, is distorted. In some embodiments, for example in the absence of the digital decompression module, the distortion may be removed by digitally linearizing the signal. Considering that the inverse of $-V\text{bias}(x/(1+x)$ is $x/(1+x/V\text{bias})$, which implies that $x=v/(1+v/V\text{bias})$, the linearization may be accomplished by digitally performing a $1/(1+v/V\text{bias})$ operation on the digitized input signal.

Figure 2:
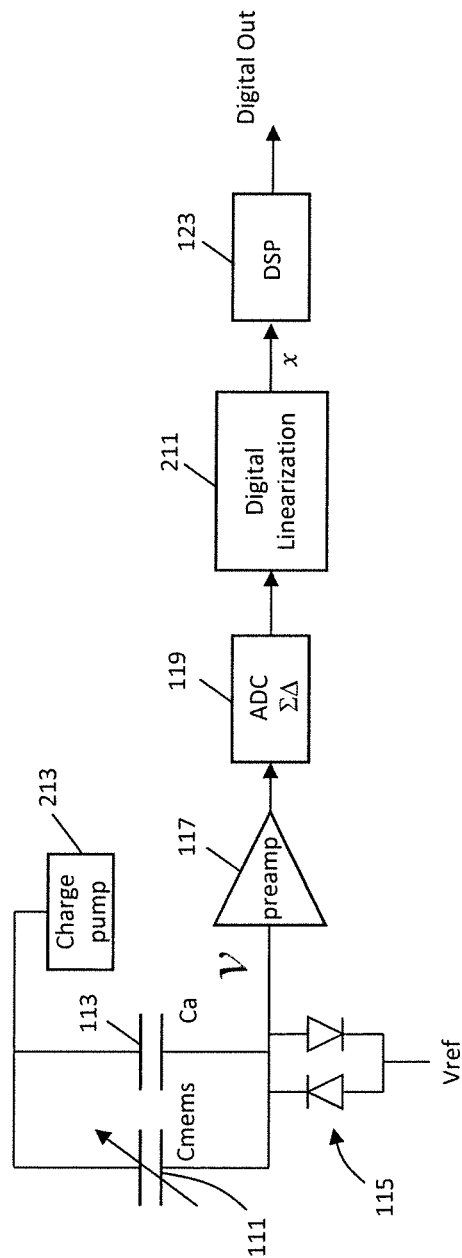
FIG. 2 is a semi-schematic, semi-block diagram of a further digital microphone in accordance with aspects of the invention.

Accordingly, in some embodiments the digital microphone may be as shown in FIG. 2. FIG. 2 is a semi-schematic, semi-block diagram of a further digital microphone in accordance with aspects of the invention. The embodiment of FIG. 2 is in large part similar to that of FIG. 1. The embodiment of FIG. 2, however, shows a digital linearization block 211 between the ADC and the DSP. The digital linearization block may perform the $1/(1+v/V\text{bias})$ operation on the digitized input signal. The embodiment of FIG. 2 also does not include a feedback signal for performing analog decompression, with the attenuation capacitor shown as having a constant capacitance. In addition, a charge pump 213 is shown as providing the bias voltage Vbias to the capacitors. The bias voltage may be, for example, 14 Volts, while a supply voltage to elements of the processing chain may be lower, for example 1.8 Volts.

Figure 3:
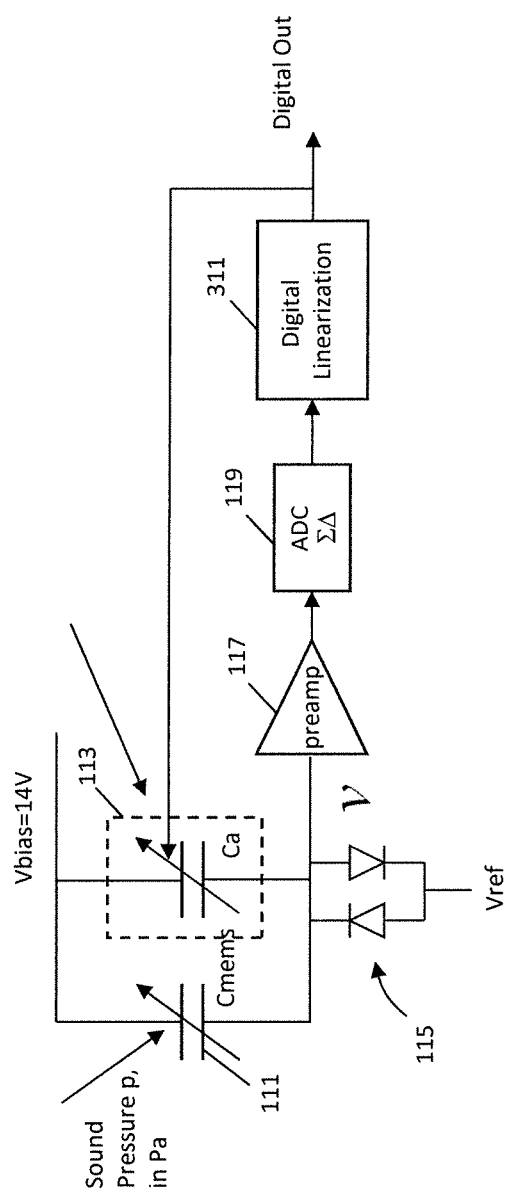
FIG. 3 is a semi-schematic, semi-block diagram of a yet further digital microphone in accordance with aspects of the invention.

FIG. 3 is a semi-schematic, semi-block diagram of a yet further digital microphone in accordance with aspects of the invention. The embodiment of FIG. 3 is similar to that of FIG. 2, with the DSP and linearization block combined into a DSP and linearization block 311. The embodiment of FIG. 3, however, also includes a feedback signal, from the DSP and linearization block, for use in modifying capacitance of the attenuation capacitor.

Returning to discussion of the analog compression, it may be recalled that generally $$v=-V\text{bias}((kp/(1+Ca/Cm)/(1+kp/(1+Ca/Cm)).$$

In some embodiments Ca/Cm may be replaced with N/x/, with N being a compression index. In such a situation, and after algebraic simplification, $$v=-V\text{bias}(x/(1+x+N|x|)).$$

This may be rewritten as $v=-V\text{bias}(x/((1+(N+1)|x|)$, for x greater than zero, and
$v=-V\text{bias}(x/(1+(N-1)|x|)$ for x less than zero.

As is recognized, such may be implemented with analog components.

Figure 4:
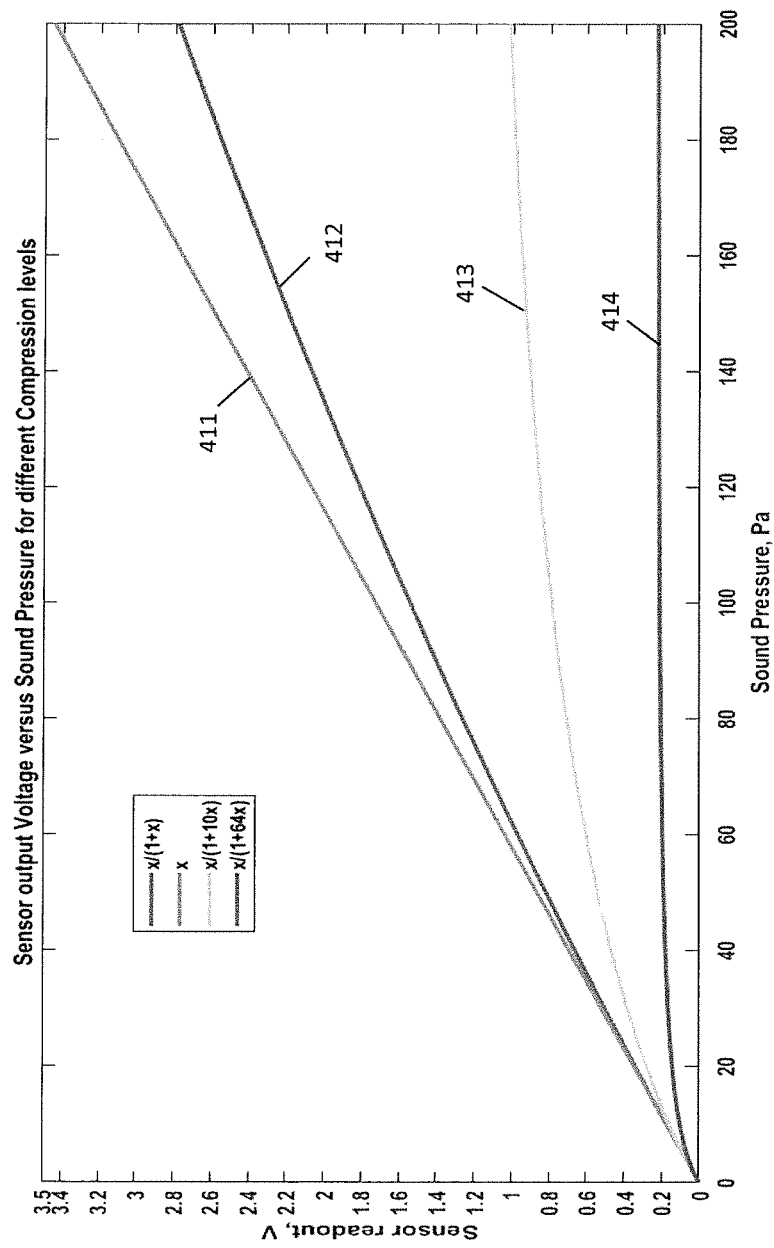
FIG. 4 is a chart of sensor output voltage vs sound pressure for different compression levels.

FIG. 4 is a chart of sensor output voltage vs sound pressure for different compression levels. The chart indicates sensor readout, in volts, for a digital microphone, for example the digital microphone of FIGS. 1-3, along a vertical y-axis. The chart indicates sound pressure applied to the sensor, in Pascals, along a horizontal x-axis. The sound pressure ranges from 0 to 200 Pascals, appropriate as a very loud sound, for example a jet at takeoff, may generate 200 Pa RMS at a distance of 50 meters.

The chart includes four curves of sensor readout versus pressure. A first curve 411 shows sensor readout versus pressure for no compression. The first curve rises above 3 Volts. 3 Volts is generally greater than supply voltage for current integrated circuitry, which may be for example 1.8 Volts. Accordingly, relatively large charge pumps may be required to properly bias the sensor, without compression. A second curve 412 shows sensor readout versus pressure for a system using a compression index of 1. The second curve rises to about 2.8 Volts, still greater than the 1.8 Volt supply voltage commonly currently used for integrated circuitry. Moreover, the second curve rises above 1.8 Volts at approximately 120 Pa. A third curve 413 shows sensor readout versus pressure for a system using a compression index of 10. The third curve rises to only about 1 Volt, less than the 1.8 Volt supply voltage common for integrated circuitry. A fourth curve 414 shows sensor readout versus pressure for a system using a compression index of 64. The fourth curve rises to only about 0.2 Volts, also less than the 1.8 Volt supply voltage common for integrated circuitry.

Returning to FIG. 1, in some embodiments the analog compression is performed as discussed with respect to FIG. 3. The digital decompression performed by the digital decompression module performs an operation that is generally the inverse of the analog compression operation. More particularly, in view of the discussion above, relating to the analog compression, $v=-V\text{bias}(x/((1+(N+1)|x|)$, for x greater than zero, and
$v=-V\text{bias}(x/(1+(N-1)|x|)$ for x less than zero.

The inverse may be considered as $x=v/(1-(N+1)|v|/V\text{bias})$ for x greater than zero, and
$x=v/(1-(N+1)|v|/V\text{bias})$ for x less than zero.

In some embodiments, therefore, the digital decompression module performs the inverse operations. As is recognized, such operations may be implemented digitally.

Figure 5:
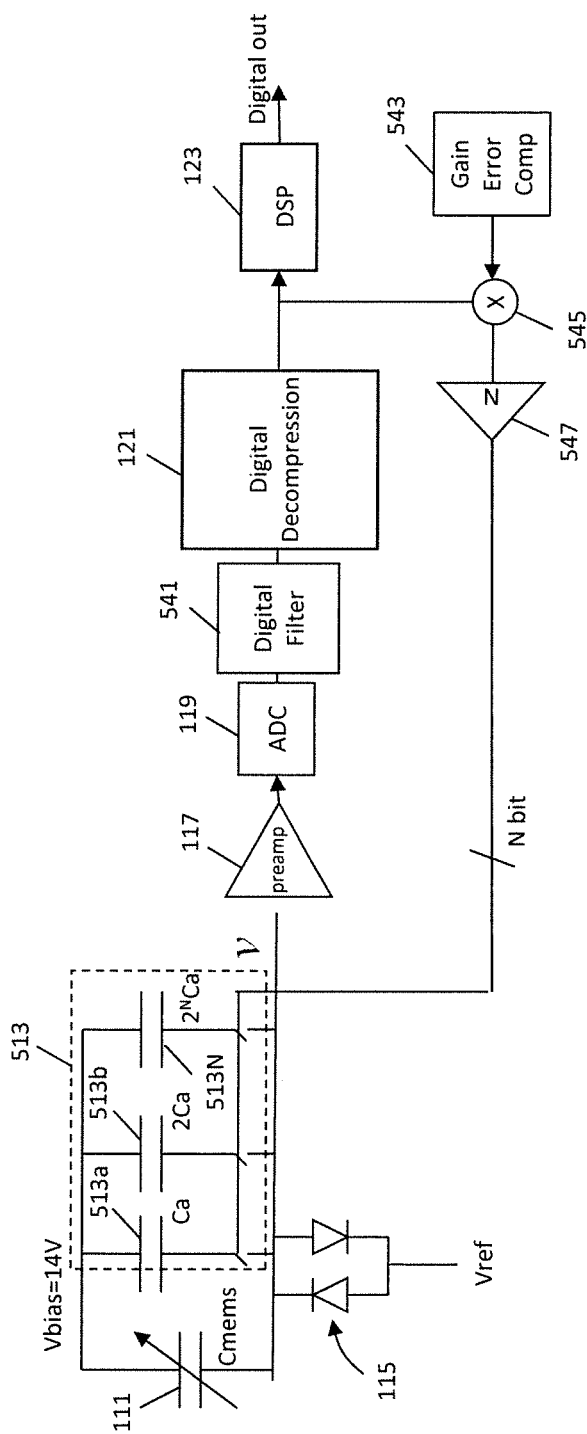
FIG. 5 is a semi-schematic, semi-block diagram of a still yet further digital microphone in accordance with aspects of the invention.

FIG. 5 is a semi-schematic, semi-block diagram of a still yet further digital microphone in accordance with aspects of the invention. The embodiment of FIG. 5 is similar to that of FIG. 1, with additional features shown. As with FIG. 1, a MEMS capacitor 111 serves as a sensor for the digital microphone. A compressed output of the MEMS capacitor, compressed using attenuation capacitors 513, is provided as a voltage input v to a processing chain. The processing chain, as with the embodiment of FIG. 1, includes a pre-amplifier and ADC, sequentially. Output of the ADC is provided to a digital decompression module, but after being passed through a digital filter block 541. The digital filter block is configured to suppress quantization noise generated by the ADC. The digital decompression module may be as discussed with respect to FIG. 1.

The attenuation capacitors are shown as a plurality of capacitors 513a-N, arranged in parallel with the MEMS capacitor. The N attenuation capacitors are selectively coupled in parallel with the MEMS capacitor based on values of an N bit selection signal. In some embodiments the N attenuation capacitors are part of a switched capacitor DAC. In some embodiments the N bit selection signal is provided by a digital-to-analog converter (DAC) 547. The DAC receives a signal based on a signal from the digital decompression module, and adjusted by a digital gain error compensation signal. The digital gain error compensation signal may be provided by a gain error compensation block 543. The purpose of the digital gain error compensation signal is to account for variations in the ratio of the capacitances of the adjustment capacitors and the capacitance of the MEMS capacitor. The variations may be due to, for example, process variations in forming the capacitors, particularly considering that the adjustment capacitors and the MEMS capacitor may be different types of capacitors. In some embodiments the digital gain error compensation signal is set by the gain error compensation block based on a measured value indicative of the ratio of the capacitances of the adjustment capacitors and the capacitance of the MEMS capacitor. In some embodiments the value is stored in a register of or accessible to the gain error compensation block.

Figure 6A:
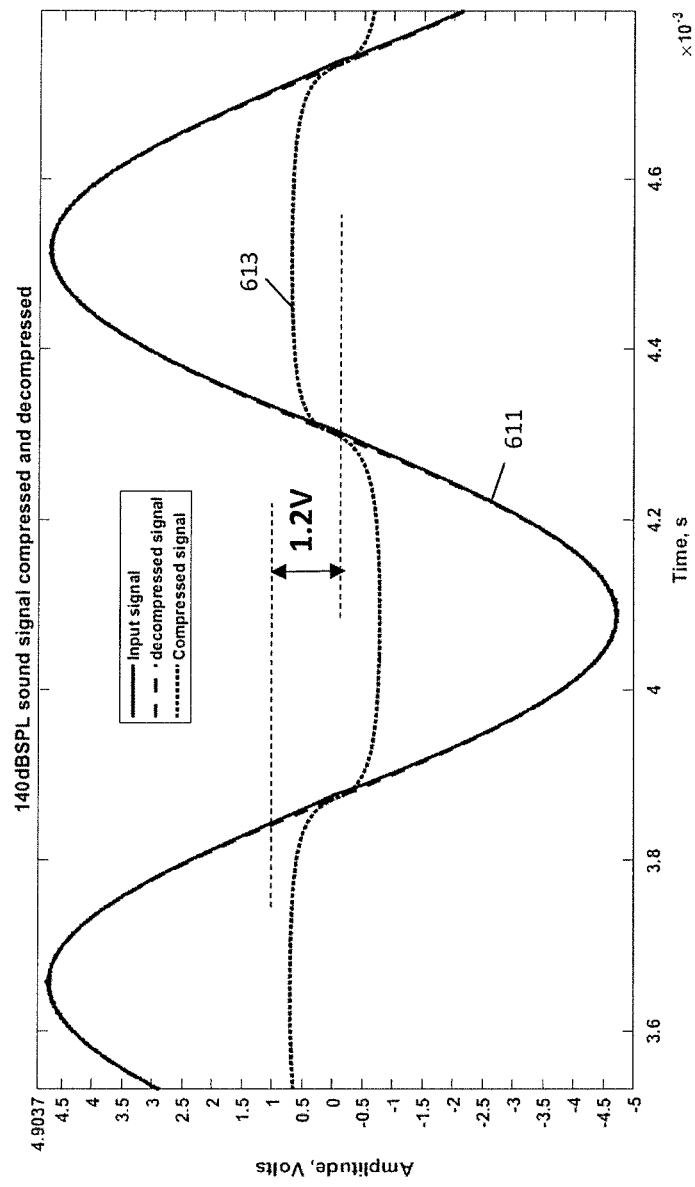
FIG. 6A is a graph showing an input signal, a compressed signal, and an uncompressed sound signal.

FIG. 6A is a graph showing an input signal, and a compressed and uncompressed sound signal. The input signal may be considered to be a sound signal as output over a period of time by a MEMS capacitor sensor biased to provide an output over a 10 volt (or possibly more) range. In FIG. 6, a vertical y-axis shows voltages from −5 to 5 Volts, and a horizontal x-axis shows time. As shown in FIG. 6, the input signal 611 is generally in a sine wave form, with an amplitude that varies roughly between −5 and 5 Volts. Also as shown in FIG. 6, the compressed signal 613 is also roughly in a sine wave form, albeit perhaps more roughly. The compressed signal, however, varies over a 1.2 Volt range. The 1.2 Volt range is generally within supply voltage limits for integrated circuitry. In some embodiments the compressed signal is compressed using the system of FIG. 5, with a compression index N=16, with a 10 bit signal used to selectively enable adjustment capacitors. The uncompressed sound signal is also generally indicated by the trace 611, as the uncompressed sound signal generally tracks the input signal.

Figure 6B:
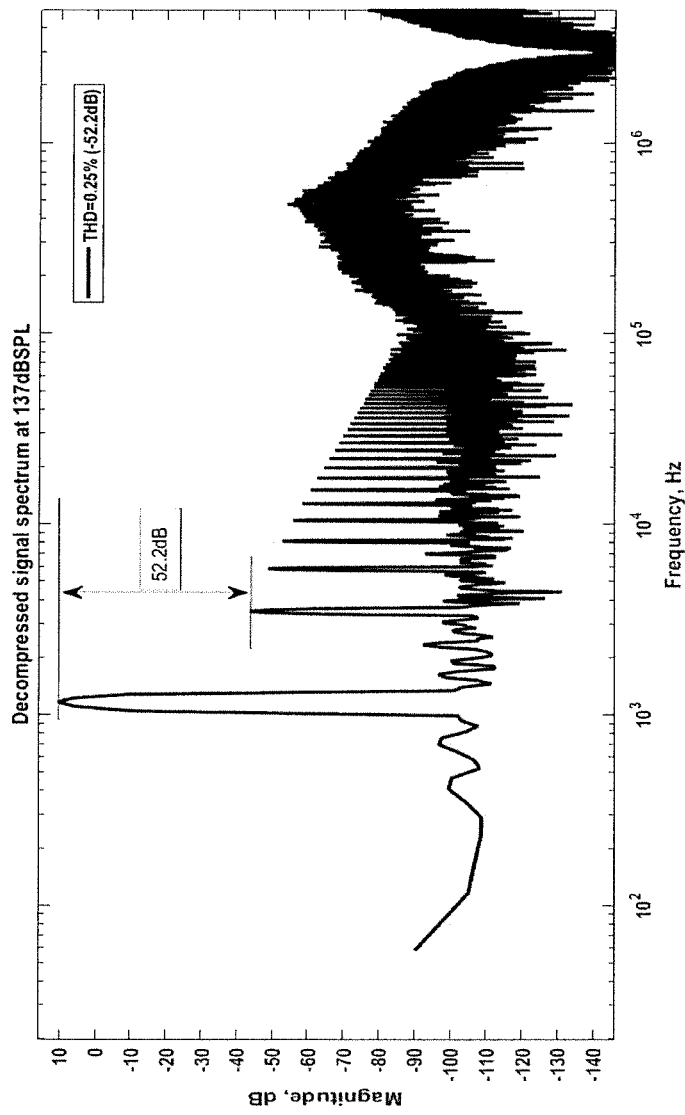
FIG. 6B is a graph showing a decompressed signal spectrum.

FIG. 6B is a graph showing a decompressed signal spectrum, for example of a signal decompressed using a system of FIG. 5. As may be seen in FIG. 6B, total harmonic distortion provided by the system is approximately 0.25 percent.

Although the invention has been discussed with respect to various embodiments, it should be recognized that the invention comprises the novel and non-obvious claims supported by this disclosure.

What is claimed is:

1. A digital microphone, comprising:
   a microelectromechanical system (MEMS) capacitor;
   a plurality of adjustment capacitors selectively coupleable in parallel to the MEMS capacitor, the adjustment capacitors selectively coupleable to the MEMS capacitor to achieve a compression in the form of $x/(1+N|x|)$ of a voltage output of the MEMS capacitor, x being related to pressure applied to the MEMS capacitor, N being a compression index number greater than 1; and
   a processing chain coupled to one side of the MEMS capacitor, the processing chain including, in sequence, a preamplifier, an analog-to-digital converter (ADC), and a decompression module, the decompression module being configured to perform a decompression substantially an inverse of the compression in the form of $x/(1+N|x|)$.

2. The digital microphone of claim 1, wherein the MEMS capacitor and adjustment capacitors are coupled to a bias voltage greater than a supply voltage coupled to the processing chain.

3. The digital microphone of claim 1, wherein the decompression module is configured to perform the decompression in a digital domain.

4. The digital microphone of claim 1, further comprising a gain error compensation block configured to adjust the compression index based on a ratio of capacitances of the MEMS capacitor and the adjustment capacitors.

5. The digital microphone of claim 1, further comprising a digital filter in the processing chain between the ADC and the decompression module, the digital filter configured to suppress quantization noise generated by the ADC.

6. The digital microphone of claim 1, wherein the ADC comprises a sigma delta ADC.

7. The digital microphone of claim 1 wherein the compression of the form $x/(1+N|x|)$ comprises compression of the form $x/(1+10x)$.

8. The digital microphone of claim 1 wherein the compression of the form $x/(1+N|x|)$ comprises compression of the form $x/(1+16x)$.

9. The digital microphone of claim 1, wherein the decompression is a decompression in a form of $v/(1-(N+1)|v|)$ for a positive voltage signal v and $v/(1-(N-1)|v|)$ for a negative voltage signal v.

10. A method for processing signals for a digital microphone, comprising:
   selectively coupling a plurality of adjustment capacitors in parallel with a microelectromechanical system (MEMS) capacitor serving as a sensor for a digital microphone, so as to perform a first compression technique on a signal generated by the MEMS capacitor;
   amplifying the signal from the MEMS capacitor, to provide an amplified signal;
   digitizing the amplified signal, to prove a digital signal; and
   performing a digital operation on the digital signal, the digital operation being an inverse of the first compression technique, wherein the first compression technique is a compression in the form of $x/(1+N|x|)$, x being related to pressure applied to the MEMS capacitor, N being a compression index number greater than 1.

11. The method of claim 10, wherein the inverse of the first compression technique is a decompression in a form of $v/(1-(N+1)|v|)$ for a positive voltage signal v and $v/(1-(N-1)|v|)$ for a negative voltage signal v.

* * * * *